United States Patent
Bhuiyan et al.

(10) Patent No.: US 12,328,935 B2
(45) Date of Patent: Jun. 10, 2025

(54) INTEGRATED INPUT OUTPUT AND LOGIC DEVICE FOR NANOSHEET TECHNOLOGY

(71) Applicant: International Business Machines Corporation, Armonk, NY (US)

(72) Inventors: Maruf Amin Bhuiyan, Albany, NY (US); Ardasheir Rahman, Schenectady, NY (US); Kevin W. Brew, Niskayuna, NY (US); Carl Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 674 days.

(21) Appl. No.: 17/457,588

(22) Filed: Dec. 3, 2021

(65) Prior Publication Data
US 2023/0178547 A1 Jun. 8, 2023

(51) Int. Cl.
| | |
|---|---|
| *H10D 84/83* | (2025.01) |
| *H01L 21/02* | (2006.01) |
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |

(52) U.S. Cl.
CPC ....... *H10D 84/83* (2025.01); *H01L 21/02532* (2013.01); *H01L 21/0259* (2013.01); *H10D 30/031* (2025.01); *H10D 30/6713* (2025.01); *H10D 30/6735* (2025.01); *H10D 30/6748* (2025.01); *H10D 30/6757* (2025.01); *H10D 62/118* (2025.01); *H10D 64/017* (2025.01); *H10D 64/018* (2025.01); *H10D 84/0128* (2025.01); *H10D 84/038* (2025.01)

(58) Field of Classification Search
None
See application file for complete search history.

(56) References Cited

U.S. PATENT DOCUMENTS

| | | |
|---|---|---|
| 6,852,575 B2 | 2/2005 | Bojarczuk, Jr. et al. |
| 10,263,100 B1 | 4/2019 | Bi et al. |
| 10,297,667 B1 | 5/2019 | Yeung et al. |
| 10,332,881 B1 | 6/2019 | Badaroglu et al. |

(Continued)

OTHER PUBLICATIONS

Hellings G et al., "Si/SiGe superlattice I/O finFETs in a vertically-stacked Gate-All-Around horizontal Nanowire Technology," 2018 IEEE Symposium on VLSI Technology, IEEE, Date: Jun. 18, 2018, pp. 85-86 [Abstract Only].

(Continued)

*Primary Examiner* — Bo B Jang
(74) *Attorney, Agent, or Firm* — Patterson + Sheridan, LLP

(57) ABSTRACT

Embodiments described herein provide for integrated input/output and logic devices for nanosheet technology and methods of fabrication for the devices. The types of transistors used for input/output devices and logic devices may differ such that, for example, input/output devices may use EG (Extended Gate) Field Effect Transistors (FET) while logic devices may use Suspended Gate (SG) FETs. Co-locating SG and EG devices on a single die provides for a fabricator to assure alignment between the nanosheets used in the SG and EG devices (improving consistency in the device characteristics on a single die) and reduce overall space requirements for the hardware used by input/output and logic devices.

19 Claims, 14 Drawing Sheets

(56) References Cited

U.S. PATENT DOCUMENTS

| | | |
|---|---|---|
| 10,566,434 B2 | 2/2020 | Hellings |
| 10,672,667 B2 | 6/2020 | Cheng et al. |
| 10,763,177 B1 | 9/2020 | Zhang et al. |
| 10,763,368 B2 | 9/2020 | Chiang et al. |
| 10,886,368 B2 | 1/2021 | Zhang et al. |
| 10,971,630 B2 | 4/2021 | Liaw |
| 2013/0099283 A1 | 4/2013 | Lin et al. |
| 2019/0378906 A1 | 12/2019 | Loubet et al. |
| 2020/0365704 A1 | 11/2020 | Chung et al. |
| 2020/0381555 A1 | 12/2020 | Lee et al. |
| 2021/0104617 A1 | 4/2021 | Hung et al. |
| 2021/0119021 A1 | 4/2021 | Colombeau et al. |

OTHER PUBLICATIONS

PCT, Notification of Transmittal of The International Search Report and The Written Opinion of The International Searching Authority, or The Declaration for Application PCT/EP2022/081831 dated Feb. 2, 2023.

INTEGRATED INPUT OUTPUT AND LOGIC DEVICE FOR NANOSHEET TECHNOLOGY

BACKGROUND

The present invention relates to nanosheet devices, and more specifically, to integrating hybridized designs having fin-based Extra Gate (EG) input-output and nanosheet-based Single Gate (SG) logic Field Effect Transistor (FET) devices in the same chip.

A nanosheet (also referred to as a gate-all-around design, multi-bridge channel, or nanobeam) is a sheet of material that confines charge transport to a two-dimensional space. Nanosheet-based SG FETs are suitable for logic applications whereas fin-based EG FETs are suitable for high voltage input-output operation. For integration in the same chip, sacrificial layers need to be removed for SG FETs while preserving them for EG FETs. SG FETs require relatively high temperature treatment during fabrication. These high temperatures can lead to homogenization of otherwise stratified layers of materials in the EG device regions, which can lead to degradation of device parameters such as on-current and charge mobility for EG devices co-located with the SG devices.

SUMMARY

One general embodiment includes a device. The device includes a base layer and a plurality of nanosheet layers, where each nanosheet layer of the plurality of nanosheet layers may include: a first semiconductor layer, a first barrier layer, and a second semiconductor layer. The second semiconductor layer may be made of a different material than the first semiconductor layer and separated from the first semiconductor layer by the first barrier layer, and a second barrier layer that separates the second semiconductor layer from an adjacent nanosheet layer of the plurality of nanosheet layers or the base layer, and a gate metal and gate oxide layer, surrounding the plurality of nanosheet layers on at least three sides and in contact with the base layer.

Another example embodiment includes a device. The device includes a base layer, a first plurality of nanosheet layers connected to the base layer, where each nanosheet layer of the first plurality of nanosheet layers may include: a first semiconductor layer, a first barrier layer, and a second semiconductor layer. The second semiconductor layer made of a different material than the first semiconductor layer and separated from the first semiconductor layer by the first barrier layer. The device also includes a second barrier layer that separates the second semiconductor layer from an adjacent nanosheet of the first plurality of nanosheet layers or the base layer. The device also includes a first gate, surrounding the first plurality of nanosheet layers on at least three sides and in contact with the base layer, and a second plurality of nanosheet layers connected to the base layer, where each nanosheet layer of the second plurality of nanosheet layers may include: a third semiconductor layer, and a second gate, surrounding the third semiconductor layer on four sides.

One general aspect includes a method. The method includes forming a first pillar of nanosheets and a second pillar of nanosheets on a base layer, where the first pillar of nanosheets are electrically isolated from the second pillar of nanosheets, where the first pillar of nanosheets and the second pillar of nanosheets may include alternating semiconductor layers made of a first semiconductor material and a second semiconductor material, different from the first semiconductor material, that are separated by a barrier material from one another. After forming a temporary gate around the first pillar of nanosheets and the second pillar of nanosheets and separating the nanosheet layers from base by spacer, the method includes: removing the temporary gate from around the first pillar of nanosheets and the second pillar of nanosheets, applying a first IL material layer around the first pillar of nanosheets, forming a first high-k material and metal gate layers around the IL layer, and removing the first semiconductor material and the barrier material from the second pillar of nanosheets. After removing the first semiconductor material and the barrier material from the second pillar of nanosheets the method includes: applying additional IL material layers around each of the semiconductor layers made of the second semiconductor material included in the second pillar of nanosheets, and forming a second gate consisting of high-k material and metal around the additional IL material layers.

DETAILED DESCRIPTION

The present disclosure provides for integrated input/output and logic devices for nanosheet technology and methods of fabrication thereof. The types of transistors used for input/output devices and logic devices may differ such that, for example, input/output devices may use EG (Extra Gate) Field Effect Transistors (FET) while logic devices may use Single Gate (SG) FETs. To fabricate a single die that includes both types of transistors, a fabricator mitigates the high temperature treatment used for SG devices from homogenizing of layers of different materials in the EG devices (thus mitigating the degradation of device parameters such as on-current and charge mobility) by including barrier layers between the stratified layers in the EG devices. By being able to co-locate SG and EG devices on a single die, a fabricator can assure alignment between the nanosheets used in the SG and EG devices (improving consistency in the device characteristics on a single die) and reduce overall space requirements for the hardware used by input/output and logic devices.

As will be appreciated, because some of the Figures depict in-process fabrication of the FETs, a given figure may include temporary elements that are not included in the final device or have shapes and size of elements that differ from those in the final layout. Similarly, various elements may be absent at various stages of fabrication, and are therefore absent in view that would otherwise include those elements at a later time during fabrication. Additionally, although shown with various sizes, shapes, and quantities of components in the Figures, the elements are provided as non-limiting examples to illustrate potential embodiments of FETs, which may include different sizes, shapes, and quantities of components from those illustrated in the Figures. Furthermore, various elements may be intentionally omitted or resized to better show certain relationships between the other elements.

Figure 1A:
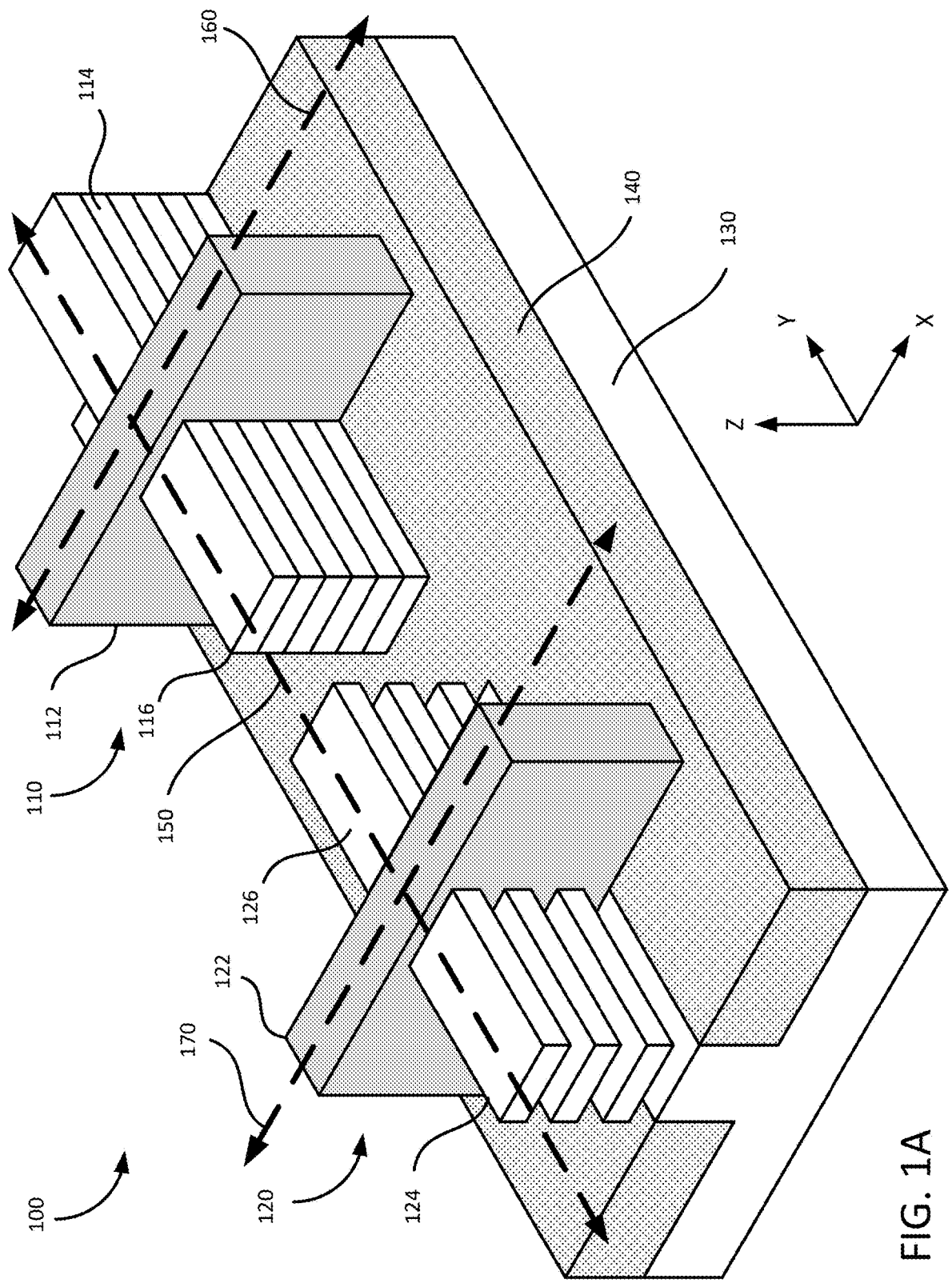
FIGS. 1A-1C illustrate EG-FETs and SG-FETs located on a single die, according to embodiments of the present disclosure.

With reference now to FIG. 1A, an EG-FET 110 is shown co-located with an SG-FET 120 on a single die, die 100, according to embodiments of the present disclosure. The EG-FET 110 and the SG-FET 120 are both fabricated on a shared base 130 (e.g., a silicon wafer or other semiconductor) and are separated from each other via shallow trench insulation 140 (STI) formed on the base 130.

Each of the EG-FET 110 and the SG-FET 120 include various channel regions, that, are made of a semiconductor (e.g., Silicon (Si), Germanium (Ge), $Si_{1-x}Ge_x$, or the like) and are used to link a source to a drain through a gate structure that selectively permits (or blocks) the flow of current depending on whether a voltage is applied (or not applied) to the gate structure. The EG-FET 110 includes an EG-gate 112, an EG-source 114, and an EG-drain 116. Similarly, the SG-FET 120 includes an SG-gate 122, an SG-source 124, and an SG-drain 126. As is shown in greater detail in regard to FIGS. 3A-3D and 4A-4D, the construction of the channel regions and gate structures in the EG-FET 110 and the SG-FET 120 is different from one another, which allows for different performance characteristics between the EG-FET 110 and the SG-FET 120 for different connected devices.

FIG. 1A illustrates a carrier line 150 that indicates a cross-sectional line for plane (e.g., a YZ plane) that FIGS. 3A-3F may be understood by. FIG. 1 also illustrates a EG-fin line 160 and an SG-fin line 170 that indicate cross-sectional lines for planes (e.g., XZ planes) that FIGS. 4A-4D may be understood by.

Figure 1B:
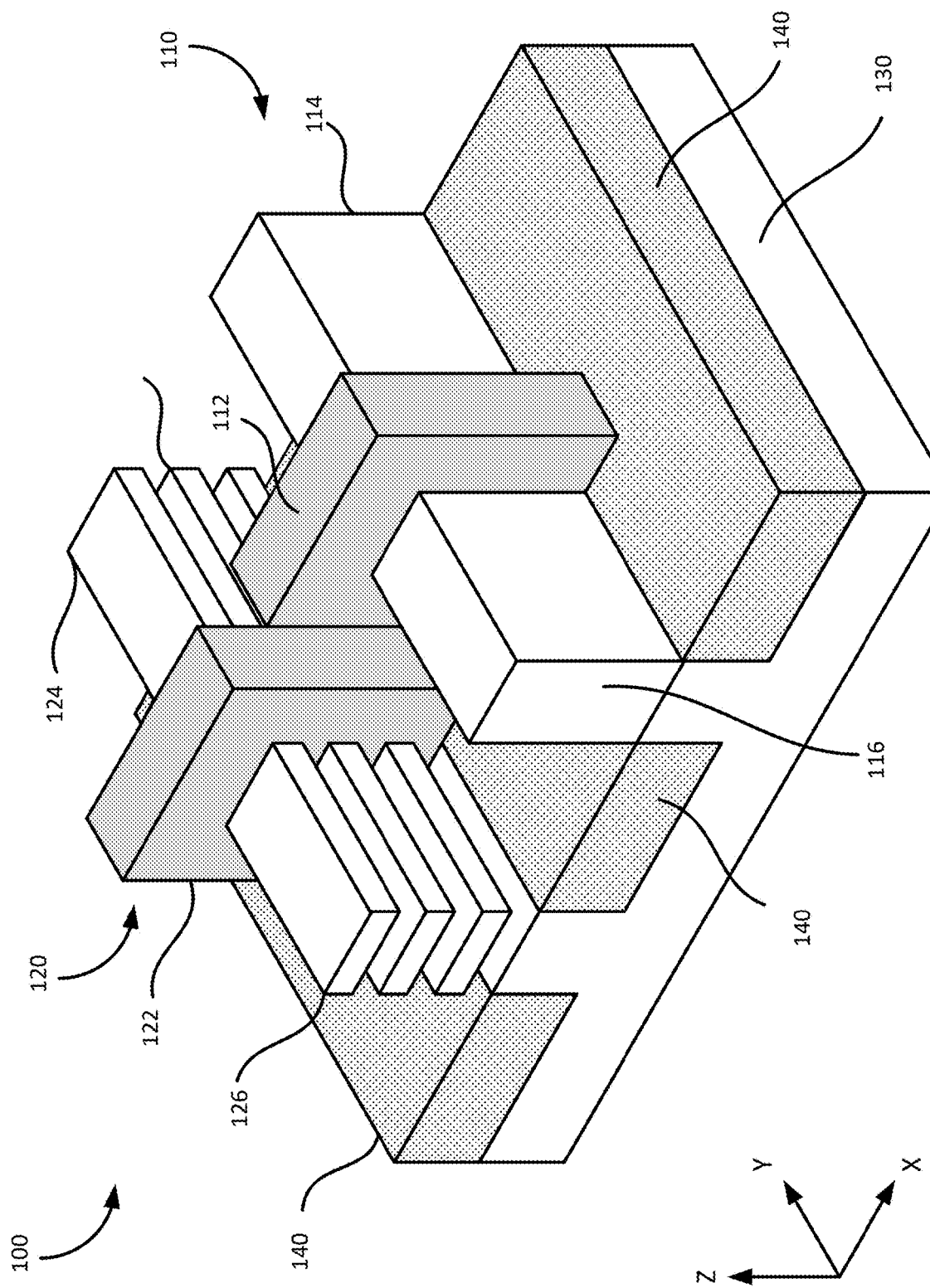

FIG. 1B illustrates an additional layout of an EG-FET 110 co-located with an SG-FET 120 on a single die, die 100, according to embodiments of the present disclosure. In various embodiments, one or more EG-FETs 110 can be co-located on single die, die 100, with one or more SG-FETs 120 in various arrangements. Accordingly, although FIG. 1A illustrates an arrangement of the FETs where the carriers of the FETs are aligned (e.g., in the Y direction) and the EG-gate 112 and the SG-gate 122 are parallel (e.g., in the X direction), and FIG. 1B illustrates an arrangement of the FETs where the carriers of the FETs are parallel (e.g., in the Y direction) and the EG-gate 112 and the SG-gate 122 are aligned (e.g., in the X direction), various other arrangements are contemplated. Additionally, several of the arrangements can be produced at different locations on a single integrated device. Stated differently, FIGS. 1A and 1B may represent different devices or different views of one device that includes both EG-FETs 110 and SG-FETs 120.

As produced, the die 100 provides a single device with two or more transistors where at least one is an EG-FET 110 and at least one is an SG-FET 120. The base 130, which may be a semiconductor substrate, provides a base layer on which the other elements are formed, such as is described in greater detail in reference to FIG. 2. A fabricator forms a first plurality of nanosheet layers to form the basis of the EG-FET 110, where each nanosheet layer of the first plurality of nanosheet layers includes a first semiconductor layer, a first barrier layer, a second semiconductor layer, made of a different material than the first semiconductor layer and separated from the first semiconductor layer by the first barrier layer, and a second barrier layer that separates the second semiconductor layer from the next nanosheet or the base 130, and the first plurality of nanosheet layers is surrounded on three sides by a gate metal (e.g., the EG-gate 112).

In various embodiments, the first semiconductor layers are made of SiGe, while the second semiconductor layers are made of Si, and each may include various dopants. The barrier material used in the barrier layers may include various materials that are lattice matched to Si to prevent the diffusion of dopants or other materials between the first and second semiconductor layers when the device is heated (e.g., when forming the SG-FET 120).

The fabricator also forms a second plurality of nanosheet layers to form the basis of the SG-FET 120 connected to the base layer, wherein each nanosheet layer of the second plurality of nanosheet layers includes a semiconductor layer surrounded on four sides by a gate metal (e.g., the SG-gate 122). In various embodiments, the semiconductor layers for each nanosheet layer of the second plurality of nanosheets layers is made of the same material as, and shares a corresponding distance from the base 130 as, a corresponding one of the first semiconductor layers from the first plurality of nanosheet layers. For example, a rare earth $M_{(x)}N_{(1-x)}O_3$ (where M and N represent different rare earth elements) with high thermal stability and etch selectivity compared to Si may be used as the barrier material in some embodiments.

Figure 1C:
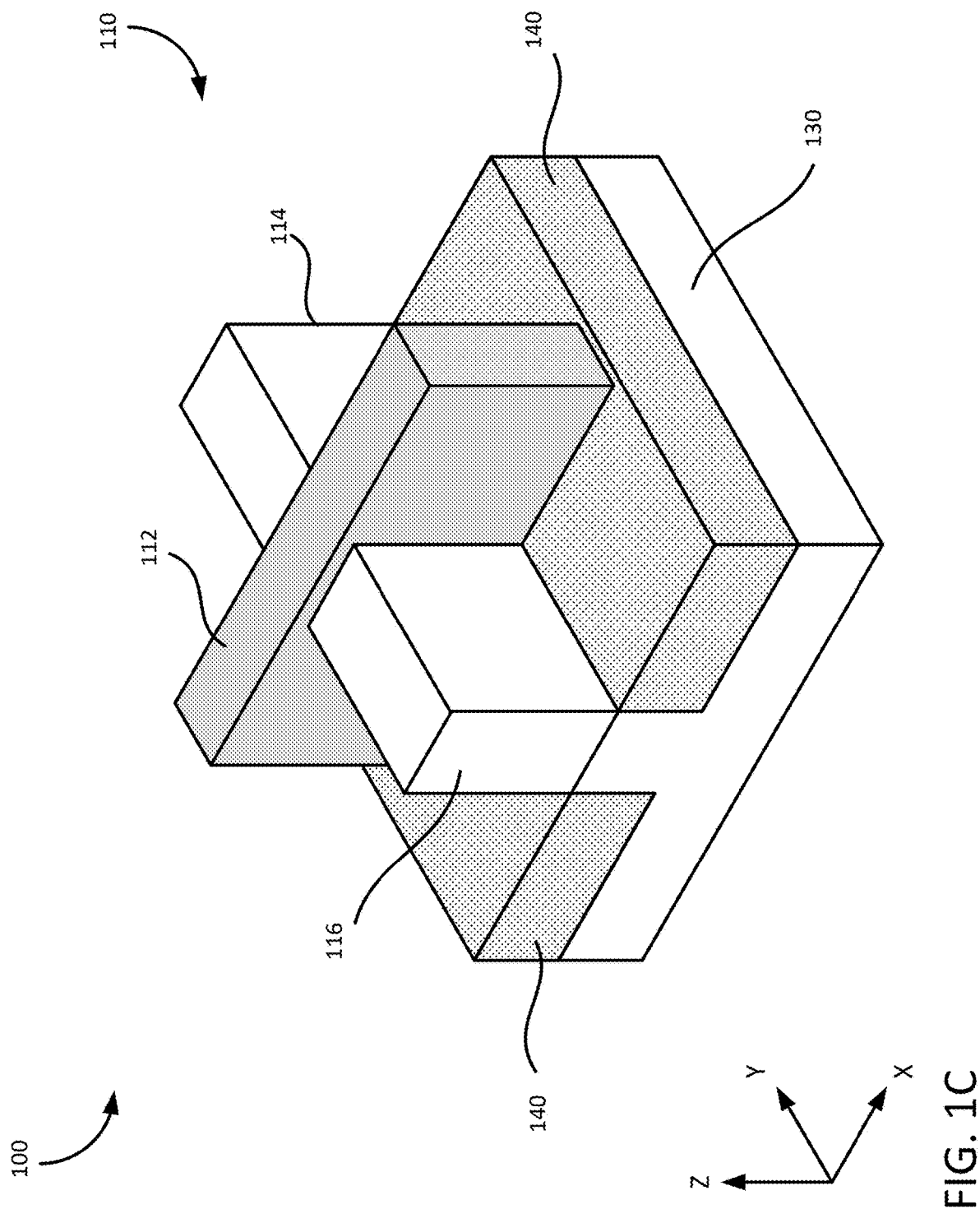

In various embodiments, the fabrication techniques and composition of an EG-FET 110 provided herein can be used to produce devices that do not include SG-FETs 120 co-located with EG-FETs 110. Such EG-FETs 110 are produced with the two semiconductor materials separated by barrier materials and may be produced on a die that excludes any SG-FETs 120 or that does not include SG-FETs 120 within a predefined distance of a given EG-FET 110. For example, FIG. 1C illustrates an additional layout of an EG-FET 110 located on a die 100 that is not shown co-located with an SG-FET 120, according to embodiments of the present disclosure. In various embodiments, the EG-FET 110 may be co-located with other EG-FETs 110 (not illustrated) or SG-FETs 120 (not illustrated) elsewhere on the die 100. Accordingly, a fabricator may choose to construct one or more EG-FETs 110 on a die 100 (and) using various barrier materials to improve the separation between the different semiconductor materials used therein, even when no SG-FETs 120 are included on that die 100.

Figure 2:
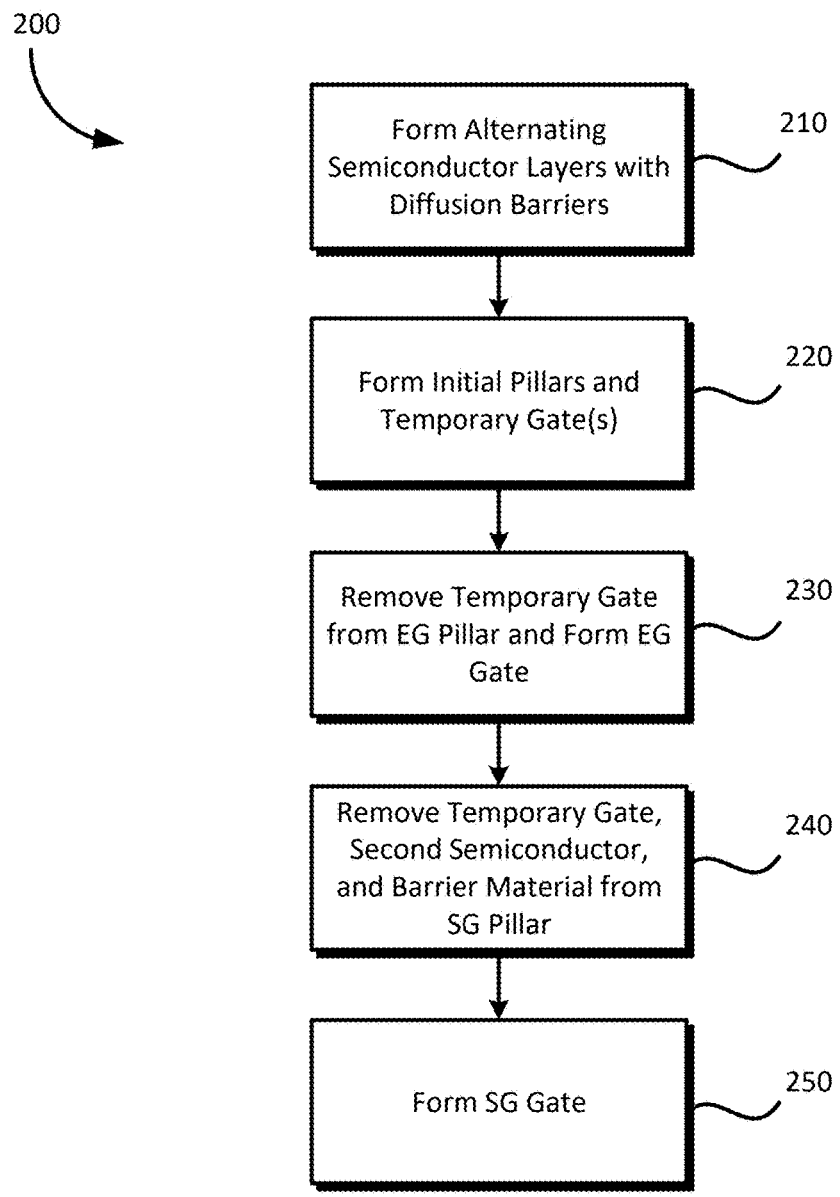
FIG. 2 is a flowchart of a method for fabrication of co-located EG-FETs and SG-FETs, according to embodiments of the present disclosure.

FIG. 2 is a flowchart of a method 200 for fabrication of co-located EG-FETs 110 and SG-FETs 120, according to embodiments of the present disclosure. Method 200 begins with block 210, where a fabricator forms alternating semiconductor layers with diffusion barriers separating layers of a first semiconductor material from layers of a second (different) semiconductor material.

Figure 3A:
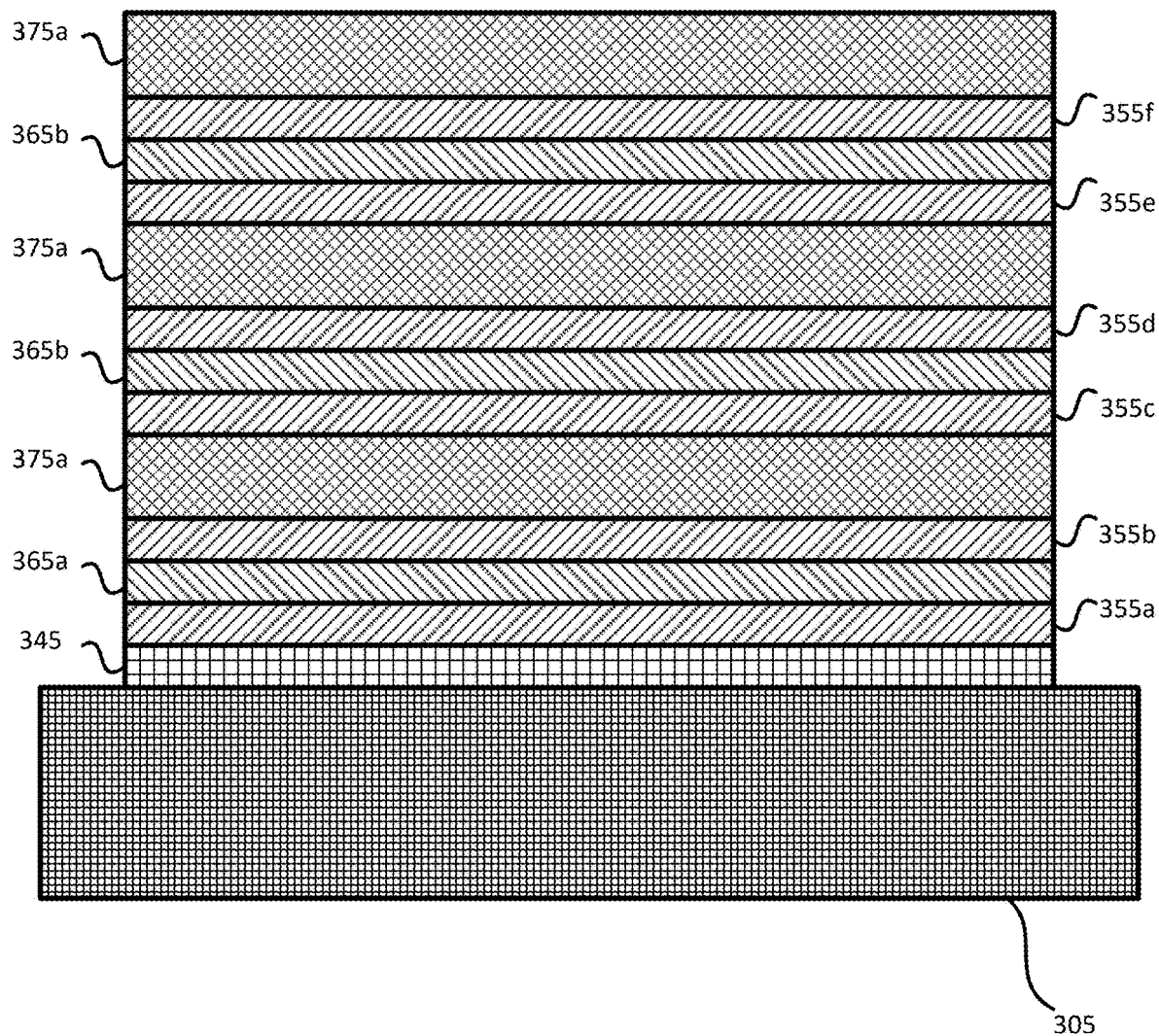
FIGS. 3A-3F are cross-sectional views taken in carrier lines of a die during fabrication of co-located EG-FETs and SG-FETs, according to embodiments of the present disclosure.

For example, as shown in FIG. 3A, a base layer 305 of a semiconductor substrate is shown with a sacrificial layer 345 (e.g., of a semiconductor layer with different etch selectivity to other layers in the structure) formed thereon with six barrier layers 355a-f (generally or collectively, barrier layer 355), three first semiconductor layers 365a-c (generally or collectively, first semiconductor layer 365), and three second semiconductor layer 375a-c (generally or collectively, second semiconductor layer 375). The barrier layers 355 separate the first semiconductor layers 365 from the second semiconductor layer 375 and separate the bottommost semiconductor layer (shown in FIG. 3A as the primary first semiconductor layer 365a) from the sacrificial layer 345. In various embodiments, the number of layers, and thicknesses thereof, may vary from that shown in the Figures.

Figure 3B:
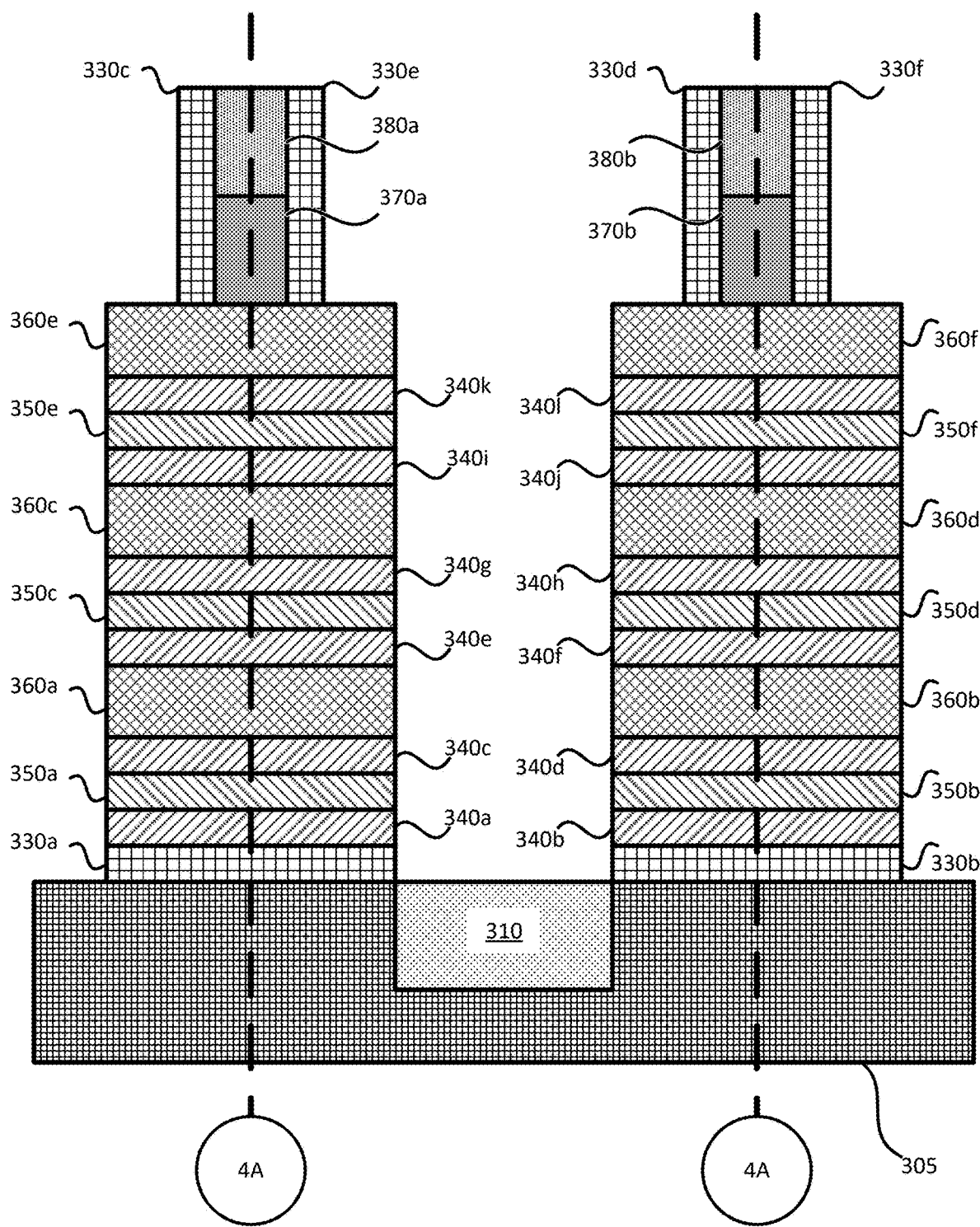

At block 220, the fabricator forms the initial pillars for the EG-FET 110 and the SG-FET 120 and forms a temporary gate structure for each of the pillars. For example, the fabricator may begin block 220 with layers of material, such as in FIG. 3A, and conclude block 220 with two (or more) pillars as shown in FIG. 3B. For example, when two pillars are shown in a carrier plane, such as in FIG. 3B, each pillar will look identical and each pillar when viewed in a fin plane through the middle of line (MOL) will also look identical, such as in FIG. 4A.

In various embodiments, the fabricator etches (via chemical, mechanical, or chemical-mechanical processes) through the layers of alternating semiconductor and barrier materials, and the sacrificial layer 345 and base layer 305 to electrically and spatially isolate the two pillars from one another and form a trench in which STI 310 may be deposited. Each of the pillars include a plurality of layers, each corresponding in composition, thickness, and height (relative to the base layer 305) as corresponding layers in the other pillars. Accordingly, the various layers are split into a plurality of nanosheet layers that will form the bases of the individual FETs as fabrication progresses.

Figure 4A:
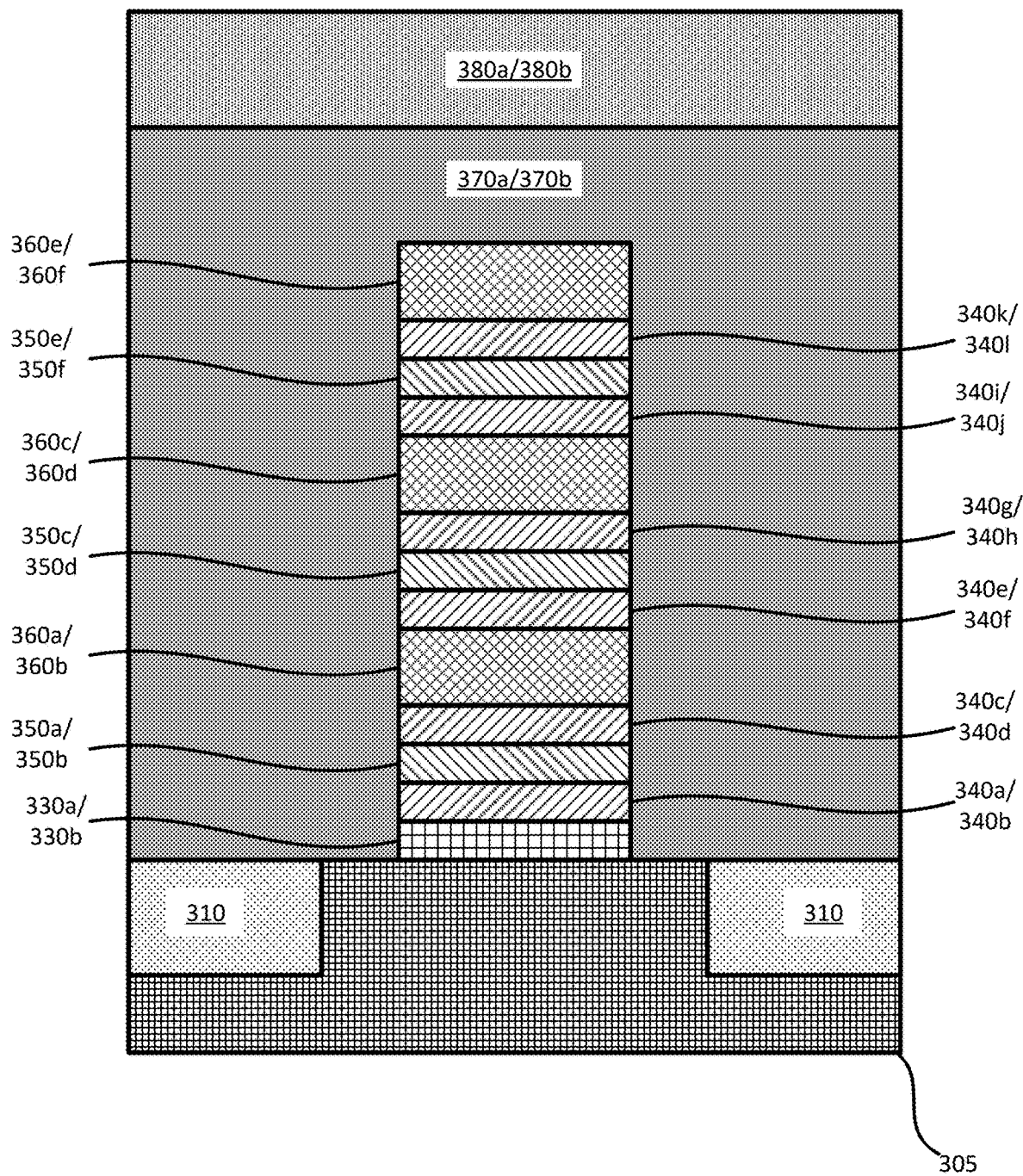
FIGS. 4A-4D are cross-sectional views taken in fin lines of a die during fabrication of co-located EG-FETs and SG-FETs, according to embodiments of the present disclosure.
Figure 4B:
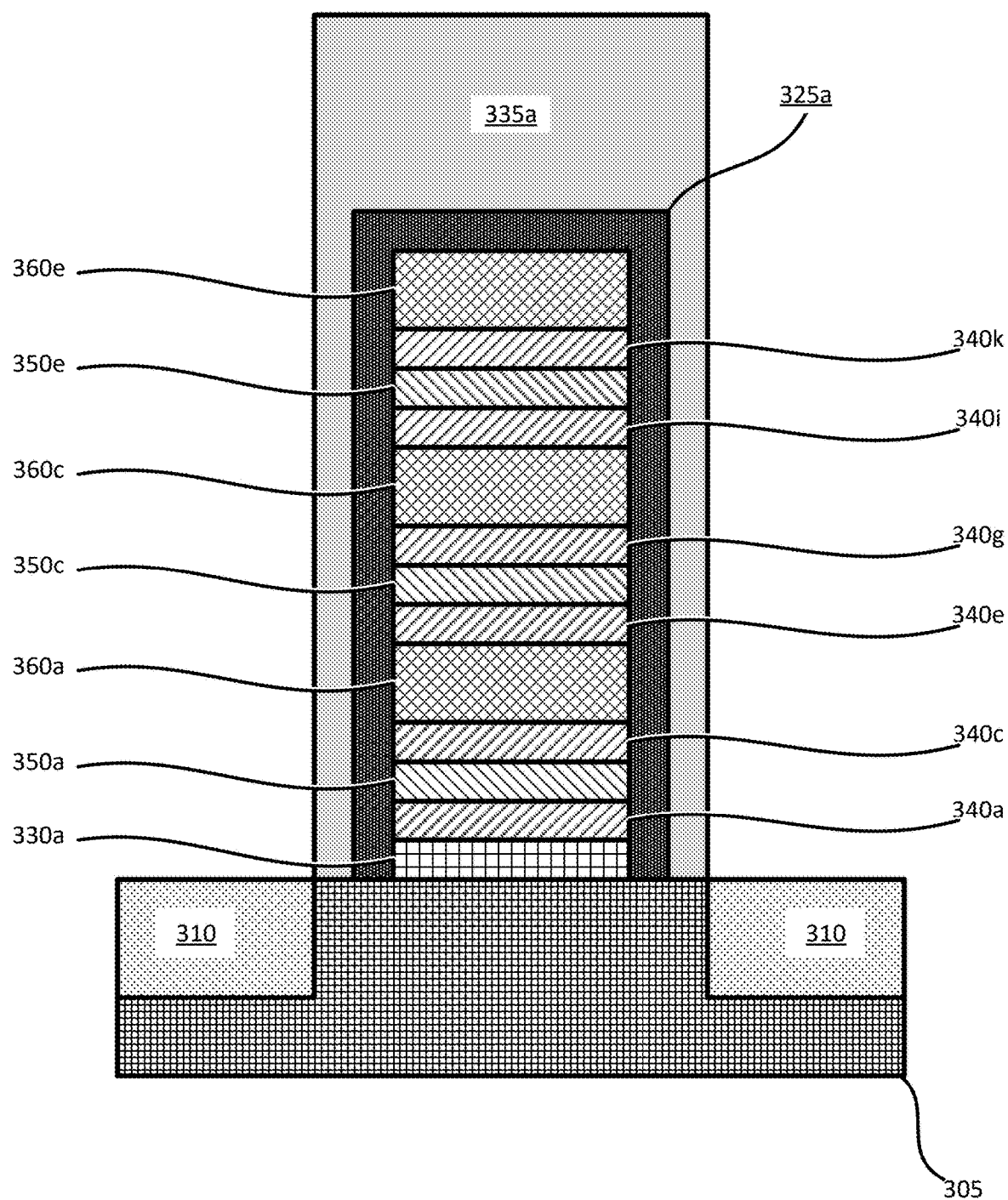

As shown in FIGS. 3B and 4A the nanosheet layers for the EG-pillar are formed on a first dielectric layer 330a (generally or collectively, spacer 330 formed by etching sacrificial layer 345 and depositing a dielectric material) and include a first barrier layer 340a (generally or collectively barrier layer 340), a primary first semiconductor layer 350a (generally or collectively first semiconductor layer 350), a third barrier layer 340c, a primary second semiconductor layer 360a (generally or collectively, second semiconductor layer 360), a fifth barrier layer 340e, a tertiary first semiconductor layer 350c, a seventh barrier layer 340g, a tertiary second semiconductor layer 360c, a ninth barrier layer 340i, a quinary first semiconductor layer 350e, an eleventh barrier layer 340k, a quinary second semiconductor layer 360e, etc. Similarly, the nanosheet layers for the SG-pillar are formed on a second spacer 330b and include a second barrier layer 340b, a secondary first semiconductor layer 350b, a fourth barrier layer 340d, a secondary second semiconductor layer 360b, a sixth barrier layer 340f, a quaternary first semiconductor layer 350d, an eighth barrier layer 340h, a quaternary second semiconductor layer 360d, a tenth barrier layer 340j, a senary first semiconductor layer 350f, a twelfth barrier layer 340l, a senary second semiconductor layer 360f, etc.

Generally, each nanosheet layer can be considered to include an initial barrier layer 340 that separates the nanosheet layer from the nanosheet layer below in the pillar or (for the bottommost nanosheet layer) the spacer 330, a first semiconductor layer 350, formed on the initial barrier layer 340, an intermediate barrier layer 340, formed on the first semiconductor layer 350, and a second semiconductor layer 360, formed on the intermediate barrier layer 340 and separated from the first semiconductor layer 350 by the intermediate barrier layer 340. Each pillar includes a plurality of such nanosheet layers.

The fabricator forms a first temporary gate 370a (generally or collectively, temporary gate 370) around the EG-pillar and a second temporary gate 370b around the SG-pillar. The temporary gates 370 may be made of Si, polysilicon, or another material to temporarily hold components of the EG-FET 110 and SG-FET 120 in place during fabrication and to allow the deposition of other components before the actual gate metals are deposited. For example, after forming the temporary gates 370, the fabricator may form a first spacer 380a (generally or collectively spacer 380), a second spacer 380b, a third spacer 330c, a fourth spacer 330d, a fifth spacer 330e, and sixth spacer 330f on the topmost nanosheet layer of the pillars. In various embodiments, the spacers 380 are made of a plurality of dielectrics such as approximately 3 nanometers (nm) of silicon dioxide ($SiO_2$) and/or high aspect ratio process (HARP)/=silicon nitride (SiN)/SiO2 hard mask. In various embodiments, depending on the relative heights of the HKMG layer 335 and intended spacer 330, the fabricator may omit the spacers 380.

Figure 3C:
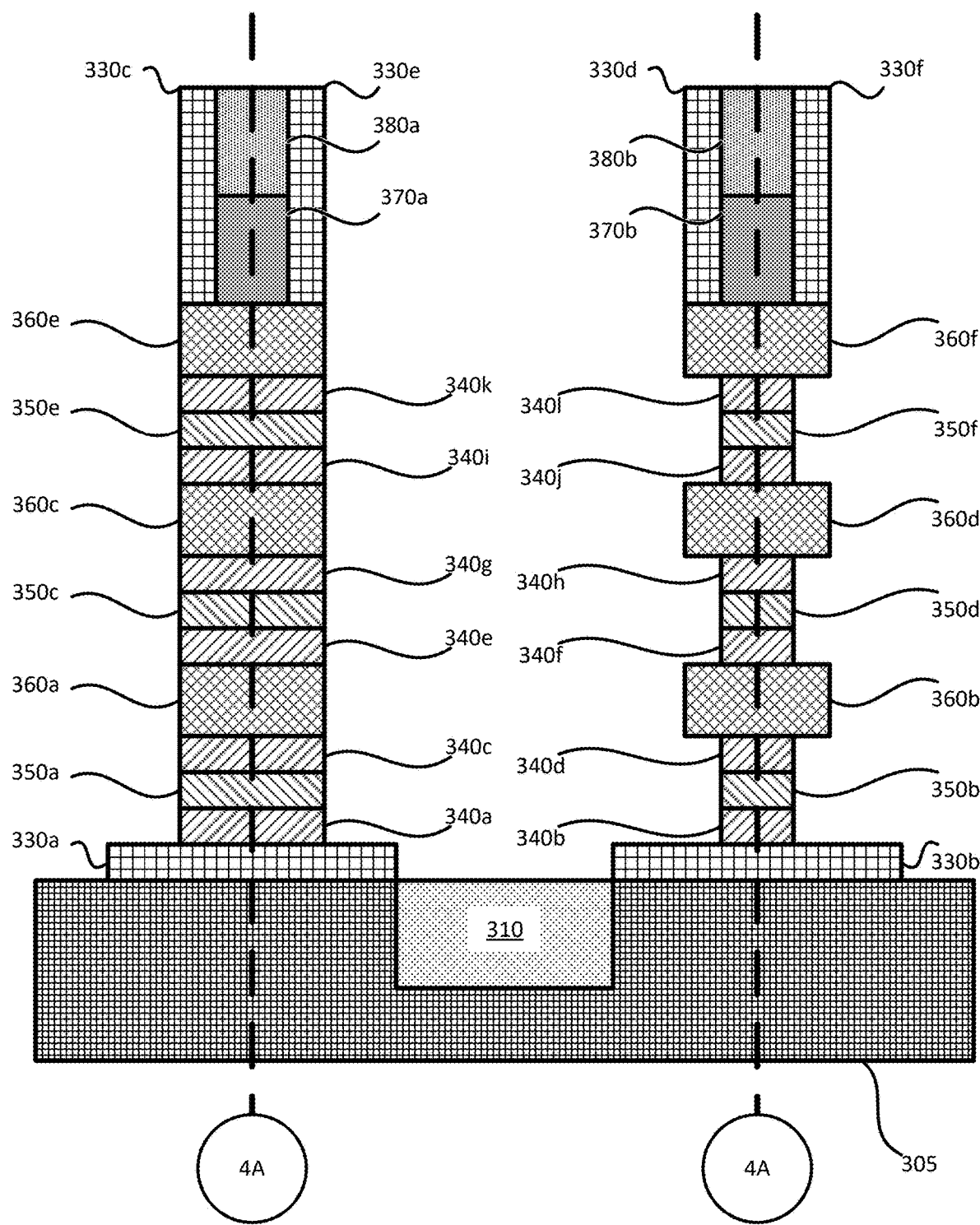

The fabricator may continue to form the pillars by etching away (via chemical, mechanical, or chemical-mechanical processes) at the nanosheet layers to define a desired shape for the various layers. For example, as shown in FIG. 3C, the fabricator has etched away the nanosheet layers in the EG-pillar to make the edges of the nanosheet layers parallel with the outer edges of the third spacer 330c and the fifth spacer 330e. In contrast, as shown in FIG. 3C, the fabricator has etched away the nanosheet layers in the SG-pillar to make the edges of the second semiconductor layers 360 parallel with the outer edges of the fourth spacer 330d and the sixth spacer 330f, while etching the barrier layers 340 and the first semiconductor layers 350 further inward to the MOL for the SG-pillar.

Figure 3D:
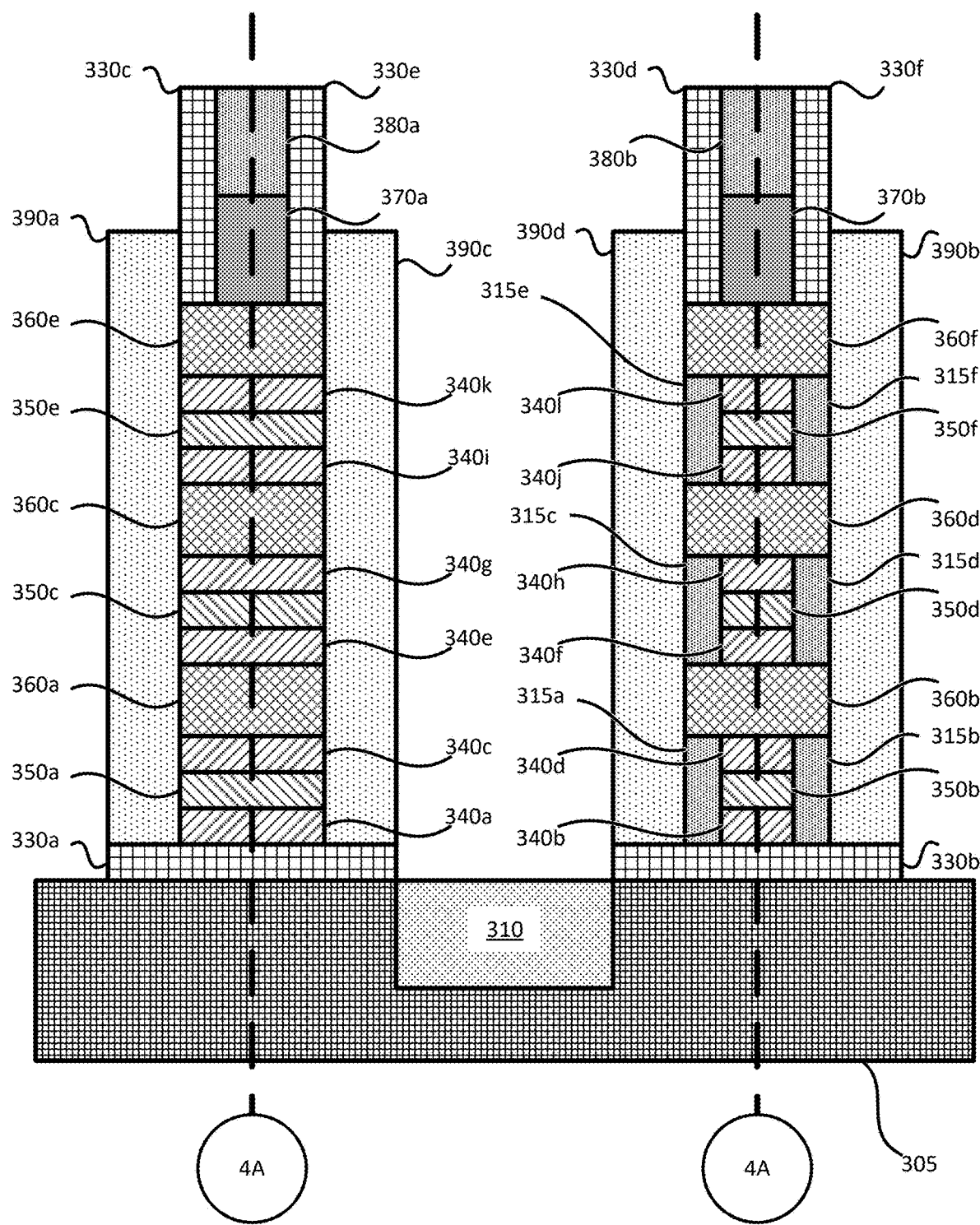

This further inward etching of the barrier layers 340 and the first semiconductor layers 350 in the SG-pillar defines various voids in which the fabricator can later define inner spacers 315a-f (generally or collectively inner spacer 315) within the nanosheet layers for the SG-pillar, such as are shown in FIG. 3D. In various embodiments, the inner spacers 315 are made of the same material as the spacer 330, and fill the voids etched into the barrier layers 340 and the first semiconductor layers 350 to be parallel with the outer edges of the second semiconductor layer 360. During the inner spacer formation in the SG-pillars, the EG pillars can be covered with protective materials to prevent such formation in those areas.

Once the inner spacers 315 are formed, the fabricator forms source-drain region 390a-d (generally or collectively, conductive layers 390) around the nanosheet layers. In various embodiments, the conductive layers 390 are made of highly doped silicon and/or silicon-germanium alloy.

At block 230, the fabricator covers SG pillars with protective materials and removes the first temporary gates 370a from the EG pillar (and any spacers 380a, if included), followed by forming the first IL material layer 325a of the EG-gate 112 (generally or collectively, IL layer 325) and a first high-k-HKMG layer 335a comprised of high-k oxide followed by metals (generally or collectively, HKMG layer 335). In various embodiments, the fabricator uses layers like Tungsten Nitride (WN), Tantalum Nitride (TaN), Titanium Nitride (TiN), Niobium, etc., for the metals and Hafnium Dioxide ($HfO_2$), Hafnium Oxynitride (HfON), or another material having a high dielectric constant (k) for the high-k oxide layer to form the HKMG layer 335. When forming the EG-FET 110 from an associated pillar, the first IL material layer 325a is applied to surround the nanosheet layers on three sides and the first HKMG layer 335a is applied to surround the first IL material layer 325a on three sides, such as is shown in the fin plane cross-sectional view of FIG. 4B and corresponding carrier plane cross-sectional view of FIG. 3E.

Figure 3E:
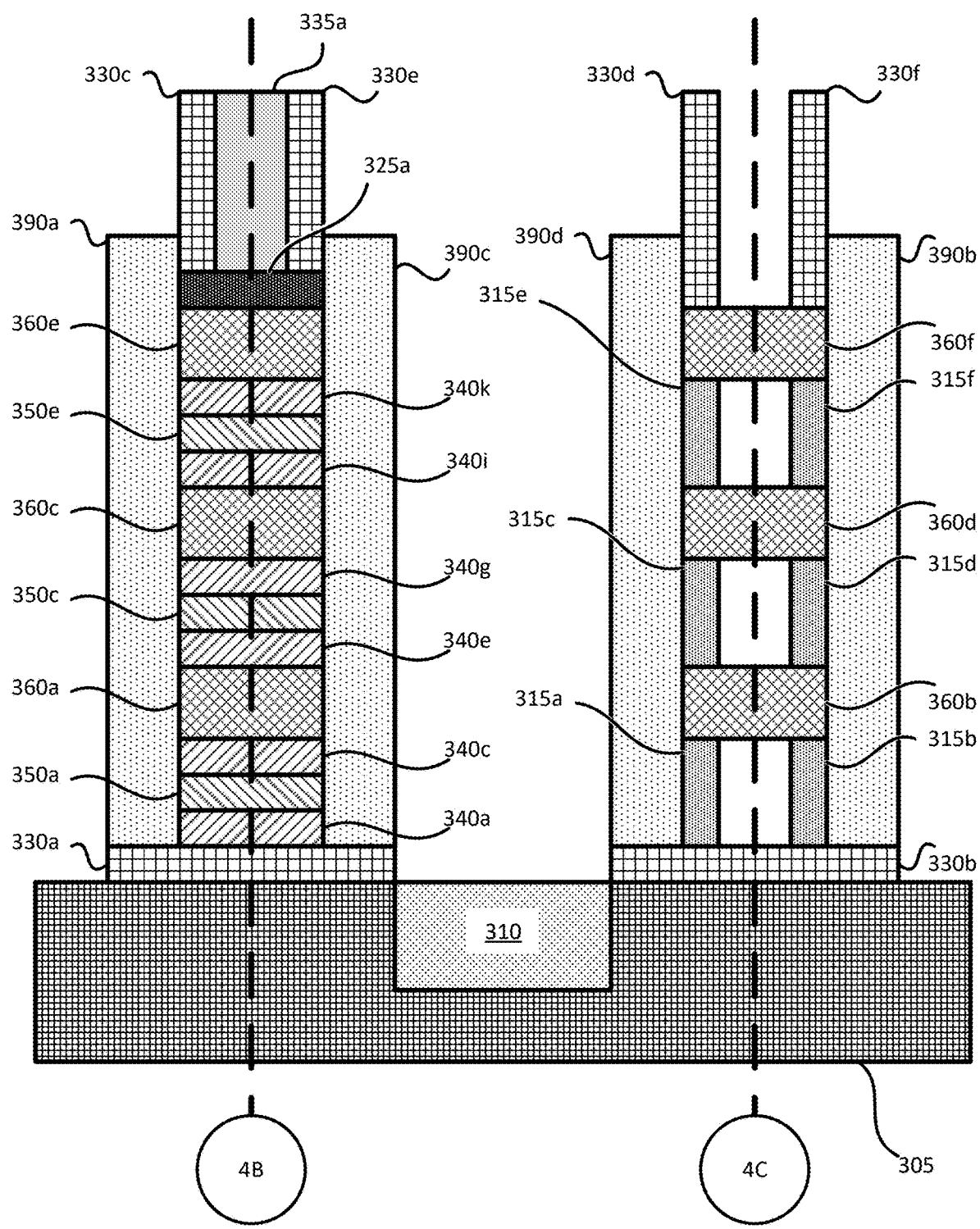
Figure 4C:
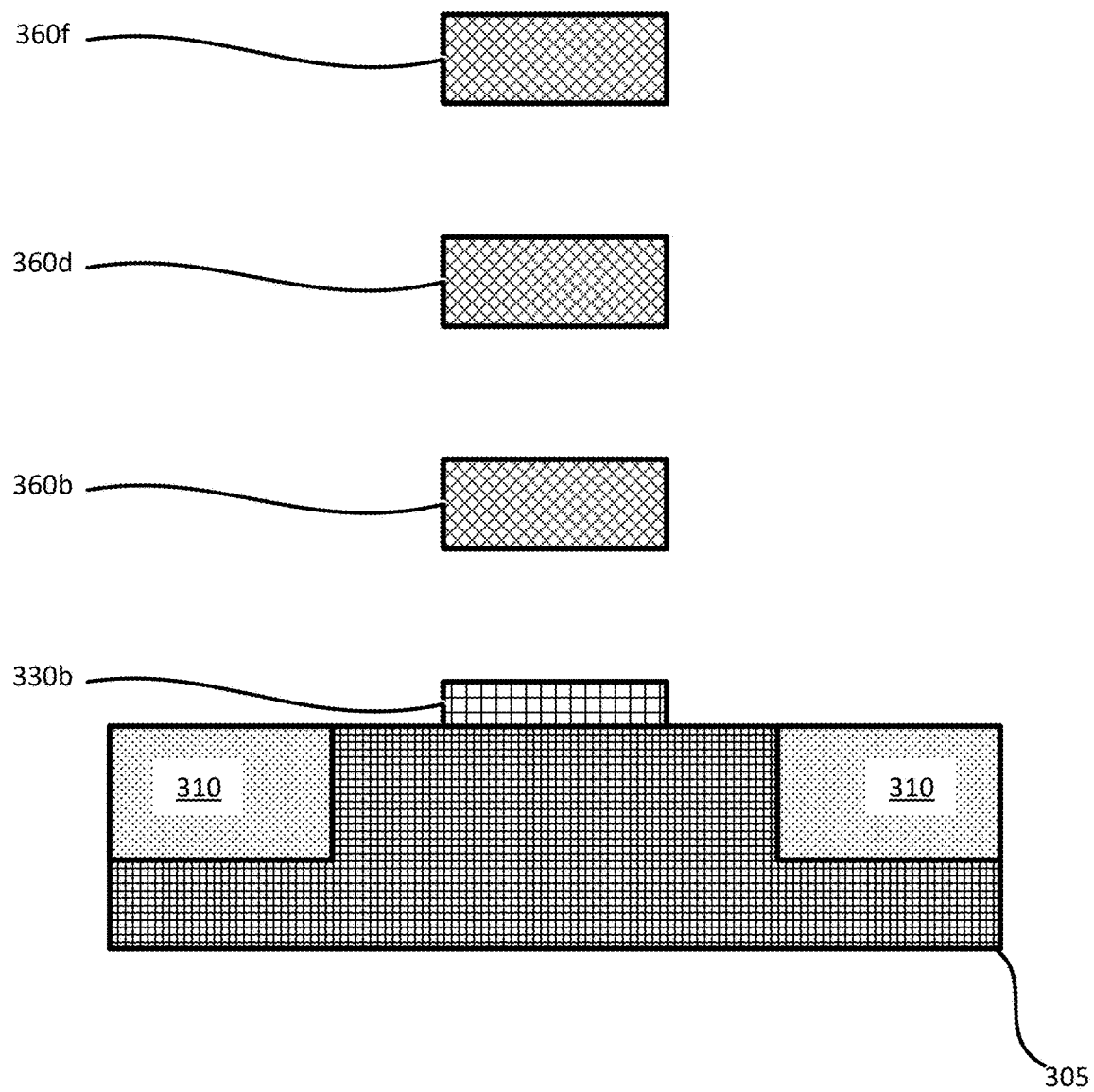

At block 240, the fabricator covers the EG-pillars with protective materials and removes the second temporary gate 370b (and any spacers 380b, if included), the first semiconductor layers 350 and the barrier layers 340 from the SG-pillar of nanosheets; leaving the second semiconductor layer 360 and inner spacers 315 as shown in the carrier plane cross-sectional view in FIG. 3E and in the fin plane cross-sectional view of FIG. 4C. In various embodiments, the fabricator removes the second temporary gate 370b, the first semiconductor layers 350, and the barrier layers 340 via various selective etching processes.

Figure 3F:
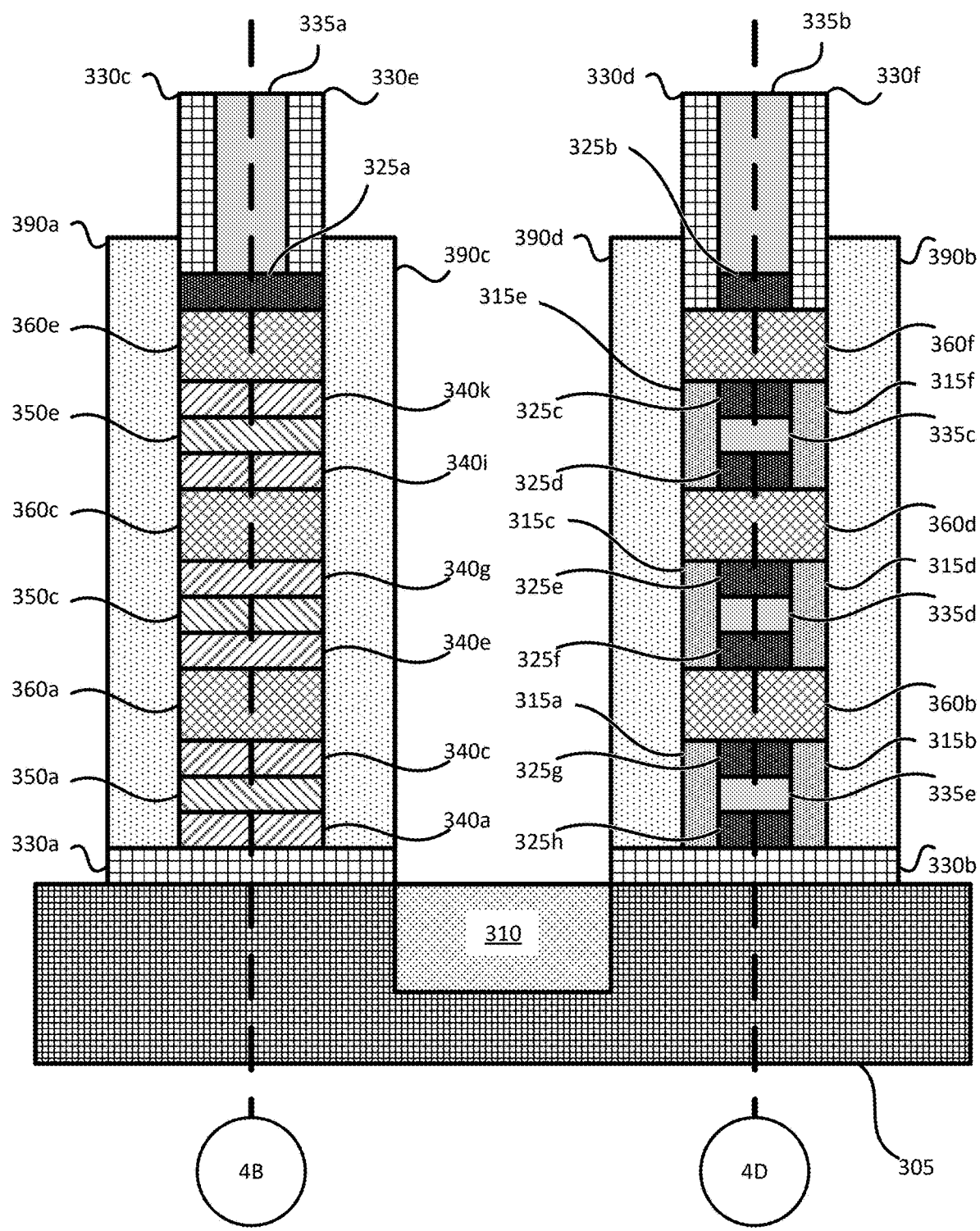
Figure 4D:
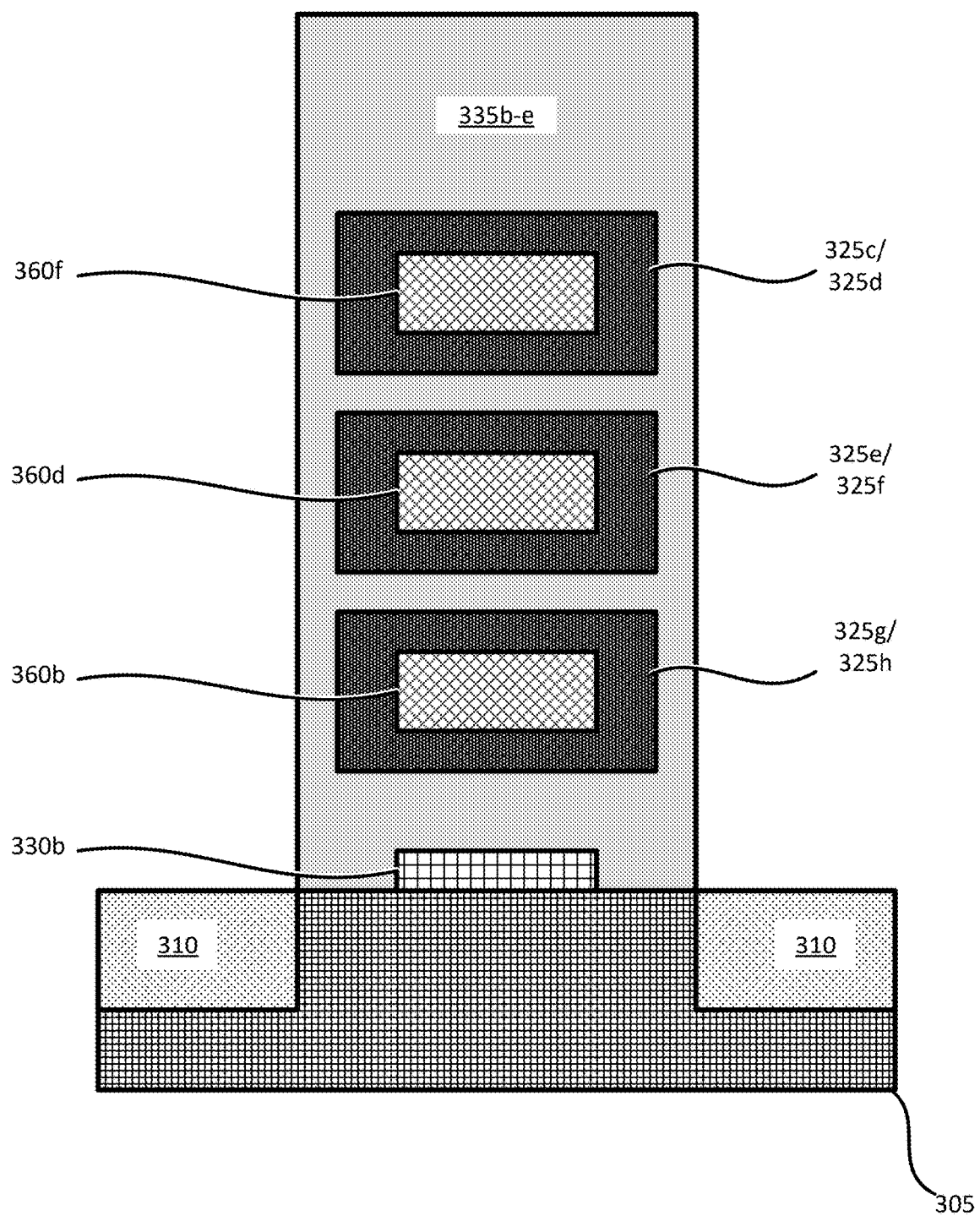

After performing block 240, the fabricator forms the SG-gate 122 by applying second IL material layers 325b around each of the second semiconductor layers 360 in the SG pillar and applying a second HKMG layer 335b around the additional IL material layers 325b in a designed form factor, as shown in the carrier plane cross-sectional view in FIG. 3F and in the fin plane cross-sectional view of FIG. 4D.

As shown in FIG. 4D, the additional IL material layers surround each of the second semiconductor layers 360 on four sides, and the resulting structures are "suspended" in the second through fifth gate layers 335b-e. As shown in FIG. 3F, the additional IL material layers 325 include a second silicon oxide/nitride based layer 325b that separates the senary second semiconductor layer 360f from the second HKMG layer 335b, and a third silicon oxide/nitride based layer 325c that separates the senary second semiconductor layer 360f from a third HKMG layer 335c. Similarly, a fourth silicon oxide/nitride based material layer 325d separates the quaternary second semiconductor layer 360d from the third HKMG layer 335c, a fifth silicon oxide/nitride based layer 325e separates the quaternary second semiconductor layer 360d from a fourth HKMG layer 335d, a sixth silicon oxide/nitride based layer 325f separates the secondary second semiconductor layer 360b from the fourth HKMG layer 335d, a seventh silicon oxide/nitride based layer 325g separates the secondary second semiconductor layer 360b from a fifth HKMG layer 335e, and an eighth silicon oxide/nitride based layer 325h separates the second spacer 330b from the fifth HKMG layer 335e.

Generally, the additional IL material layers 325 and the HKMG layers 335 applied to the SG-pillar in block 240 occupy (at least) the space formerly occupied by the barrier layers 340 and first semiconductor layers 350 in the SG-pillar.

After block 240, method 200 may conclude as the fabricator has formed at least one EG-FET 110 and at least one SG-FET 120 on an integrated device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A device, comprising:
   a base layer;
   a plurality of nanosheet layers, wherein each nanosheet layer of the plurality of nanosheet layers comprises:
   a source disposed on a first side of the plurality of nanosheet layers;
   a drain disposed on a second side, opposite to the first side, of the plurality of nanosheet layers;
   a first semiconductor layer that directly contacts the source and the drain;
   a first dopant barrier layer;
   a second semiconductor layer, made of a different material than the first semiconductor layer and separated from the first semiconductor layer by the first dopant barrier layer, and wherein the second semiconductor layer directly contacts the source and the drain; and
   a second dopant barrier layer that separates the second semiconductor layer from an adjacent nanosheet layer of the plurality of nanosheet layers or the base layer; and
   a gate metal and a gate oxide layer, surrounding the plurality of nanosheet layers on at least three sides and in contact with the base layer.

2. The device of claim 1, wherein the first semiconductor layer comprises Silicon Germanium ($Si_{1-x}Ge_x$) and the second semiconductor layer comprises Silicon (Si).

3. The device of claim 1, wherein the first dopant barrier layer and the second dopant barrier layer comprise a barrier material that is lattice matched to Silicon (Si).

4. The device of claim 3, wherein the barrier material comprises a rare earth element.

5. The device of claim 1, where in the base layer further comprises:
   a silicon substrate; and
   a spacer connected between the silicon substrate and the second dopant barrier layer of a bottommost nanosheet layer of the plurality of nanosheet layers.

6. The device of claim 1, further comprising:
   a second plurality of nanosheet layers wherein each nanosheet layer of the second plurality of nanosheet layers comprises:
   a third semiconductor layer; and
   a second gate metal and a second gate oxide layer, surrounding the third semiconductor layer on four sides.

7. The device of claim 6, wherein each third semiconductor layer for each nanosheet layer of the second plurality of nanosheet layers corresponds to one second semiconductor layer from the plurality of nanosheet layers.

8. The device of claim 6, wherein each nanosheet layer of the second plurality of nanosheet layers is separated from adjacent nanosheet layers of the second plurality of nanosheet layers by inner spacers.

9. A device, comprising:
a base layer;
a first plurality of nanosheet layers connected to the base layer, wherein each nanosheet layer of the first plurality of nanosheet layers comprises:
a source disposed on a first side of the first plurality of nanosheet layers;
a drain disposed on a second side, opposite to the first side, of the first plurality of nanosheet layers;
a first semiconductor layer that directly contacts the source and the drain;
a first dopant barrier layer;
a second semiconductor layer, made of a different material than the first semiconductor layer and separated from the first semiconductor layer by the first dopant barrier layer, and wherein the second semiconductor layer directly contacts the source and the drain; and
a second dopant barrier layer that separates the second semiconductor layer from an adjacent nanosheet of the first plurality of nanosheet layers or the base layer;
a first gate and a first gate oxide, surrounding the first plurality of nanosheet layers on at least three sides and in contact with the base layer; and
a second plurality of nanosheet layers connected to the base layer, wherein each nanosheet layer of the second plurality of nanosheet layers comprises:
a third semiconductor layer; and
a second gate and a second gate oxide, surrounding the third semiconductor layer on four sides.

10. The device of claim 9, wherein the base layer further comprises:
a semiconductor substrate;
a Shallow Trench Isolator (STI) included in the semiconductor substrate;
a first spacer connected to the semiconductor substrate on a first side of the STI and to a bottommost nanosheet layer of the first plurality of nanosheet layers; and
a second spacer connected to the semiconductor substrate on a second side, opposite to the first side, of the STI and to a bottommost nanosheet layer of the second plurality of nanosheet layers.

11. The device of claim 9, wherein each third semiconductor layer for each nanosheet layer of the second plurality of nanosheet layers shares a corresponding distance from the base layer as one first semiconductor layer from the first plurality of nanosheet layers.

12. The device of claim 9, wherein the first semiconductor layer comprises Silicon (Si) and the second semiconductor layer comprises Silicon Germanium ($Si_{1-x}Ge_x$).

13. The device of claim 9, wherein the first dopant barrier layer and the second dopant barrier layer comprises a barrier material, including a rare earth element, that is lattice matched to Silicon (Si).

14. A method comprising:
forming a first pillar of nanosheets and a second pillar of nanosheets on a base layer, wherein the first pillar of nanosheets are electrically isolated from the second pillar of nanosheets, wherein forming the first pillar of nanosheets and the second pillar of nanosheets on the base layer comprises alternating semiconductor layers made of a first semiconductor material and a second semiconductor material, different from the first semiconductor material, that are separated by a barrier material from one another, wherein the first semiconductor material comprises Silicon Germanium ($Si_{1-x}Ge_x$) and the second semiconductor material comprises Silicon (Si);
after forming a temporary gate around the first pillar of nanosheets and the second pillar of nanosheets, and separating the first pillar of nanosheets and the second pillar of nanosheets from the base layer by a first spacer and a second spacer, respectively:
removing the temporary gate from around the first pillar of nanosheets and the second pillar of nanosheets;
applying a first dielectric material layer around the first pillar of nanosheets;
forming a first metal gate layer around the first dielectric material layer; and
removing the first semiconductor material and the barrier material from the second pillar of nanosheets; and
after removing the first semiconductor material and the barrier material from the second pillar of nanosheets:
applying additional dielectric material layers around each of the semiconductor layers made of the second semiconductor material included in the second pillar of nanosheets; and
forming a second gate comprising metal around the additional dielectric material layers.

15. The method of claim 14, wherein forming the first pillar of nanosheets and the second pillar of nanosheets on the base layer further comprises:
forming a sacrificial layer
forming a first nanosheet layer on the sacrificial layer, the first nanosheet layer comprising:
a first barrier layer;
a first semiconductor layer, formed on the first barrier layer of the first semiconductor material;
a second barrier layer, formed on the first semiconductor layer; and
a second semiconductor layer, formed on the second barrier layer of the second semiconductor material;
forming a second nanosheet layer on the first nanosheet layer, the second nanosheet layer comprising:
a third barrier layer, formed on the second semiconductor layer;
a third semiconductor layer, formed on the third barrier layer of the first semiconductor material;
a fourth barrier layer, formed on the third semiconductor layer; and
a fourth semiconductor layer, formed on the fourth barrier layer of the second semiconductor material;
forming a third nanosheet layer on the second nanosheet layer, the third nanosheet layer comprising:
a fifth barrier layer, formed on the fourth semiconductor layer;
a fifth semiconductor layer, formed on the fifth barrier layer of the first semiconductor material;
a sixth barrier layer, formed on the fifth semiconductor layer; and
a sixth semiconductor layer, formed on the sixth barrier layer of the second semiconductor material;
and
etching the first nanosheet layer and the second nanosheet layer to define the first pillar of nanosheets and the second pillar of nanosheets, wherein both the first pillar of nanosheets and the second pillar of nanosheets include the sacrificial layer, first barrier layer, the first semiconductor layer, the second barrier layer, the second semiconductor layer, the third barrier layer, the third semiconductor layer, the fourth barrier layer, the fourth semiconductor layer, the fifth barrier layer, the fifth semiconductor layer, the sixth barrier layer and the sixth semiconductor layer.

16. The method of claim 15, wherein the first semiconductor material comprises Silicon Germanium ($Si_{1-x}Ge_x$) and the second semiconductor material comprises Silicon (Si).

17. The method of claim 15, wherein a barrier material of the first barrier layer, the second barrier layer, the third barrier layer, the fourth barrier layer, the fifth barrier layer, and the sixth barrier layer comprises a rare earth element and is lattice matched to Silicon (Si).

18. The method of claim 14, wherein the base layer further comprises:

a semiconductor substrate;
a Shallow Trench Isolator (STI) included in the semiconductor substrate separating the first pillar of nanosheets from the second pillar of nanosheets;
the first spacer connected to a first bottommost nanosheet layer of the first pillar of nanosheets; and
the second spacer connected to a second bottommost nanosheet layer of the first pillar of nanosheets.

19. The method of claim 14, further comprising after forming the temporary gate around the first pillar of nanosheets and the second pillar of nanosheets and before removing the first semiconductor material and the barrier material from the second pillar of nanosheets:

partially removing the first semiconductor material and the barrier material from the second pillar of nanosheets to define a plurality of voids; and
forming inner spacers in each void of the plurality of voids.

* * * * *